(12) United States Patent
Kim

(10) Patent No.: US 7,704,820 B2
(45) Date of Patent: Apr. 27, 2010

(54) FABRICATING METHOD OF METAL LINE

(75) Inventor: Dae-Kyeun Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 11 days.

(21) Appl. No.: 12/102,962

(22) Filed: Apr. 15, 2008

(65) Prior Publication Data
US 2008/0274614 A1    Nov. 6, 2008

(30) Foreign Application Priority Data
May 2, 2007    (KR) ...................... 10-2007-0042490

(51) Int. Cl.
*H01L 21/8238*    (2006.01)
(52) U.S. Cl. ..................................... 438/200
(58) Field of Classification Search ............... None
See application file for complete search history.

(56) References Cited
U.S. PATENT DOCUMENTS 6,815,331 B2 *    11/2004    Lee et al. .................... 438/622

2004/0087078 A1 *    5/2004    Agarwala et al. ........... 438/200

* cited by examiner

*Primary Examiner*—Charles D Garber
*Assistant Examiner*—Andre' C Stevenson
(74) *Attorney, Agent, or Firm*—Sherr & Vaughn, PLLC

(57) ABSTRACT

A method of fabricating a metal line using a dual damascene process which enhances reliability of the semiconductor device. The method includes forming a lower metal line in a first inter metal dielectric layer; and then sequentially forming a first anti-etch layer, a second inter metal dielectric layer and a second anti-etch layer over the first inter metal dielectric layer and the lower metal line, wherein the second inter metal dielectric includes a first trench formed therein; and then forming an oxide film on the second anti-etch layer and in the first trench; and then forming a first via hole by performing a first etching process on the oxide film, the second anti-etch layer and the second inter metal dielectric layer; and then forming a second trench and a second via hole by performing a second etching process using the second anti-etch layer as a mask; and then removing a portion of the first anti-etch layer exposed in the second via hole and the second anti-etch layer; and then forming an upper metal line in the second via hole and the second trench.

20 Claims, 5 Drawing Sheets

FABRICATING METHOD OF METAL LINE

Figure 1:
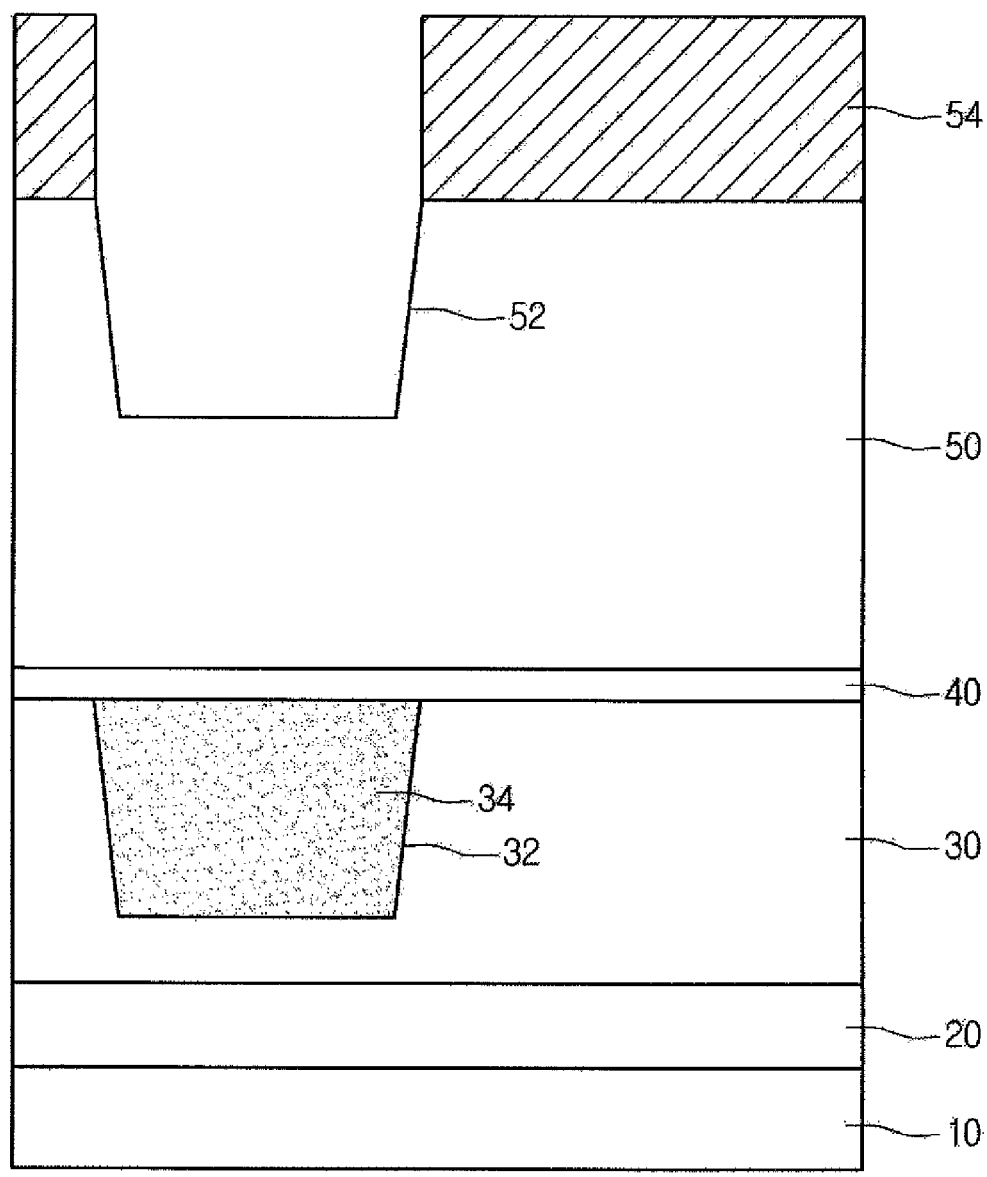

The present application claims priority under 35 U.S.C. 119 and 35 U.S.C. 365 to Korean Patent Application No. 10-2007-0042490 (filed on May 2, 2007), which is hereby incorporated by reference in its entirety.

BACKGROUND

In order to achieve high speed and high integration of a semiconductor integrated circuit, thin metal lines composed of low dielectric constant (k) materials may be formed having a multilayered structure so as to reduce a RC signal delay.

Due to difficulties in metal patterning in view of a reduction of a design rule, a damascene process capable of removing a metal etching step and an insulator gap-fill step in a fabricating method of a metal line has been developed.

SUMMARY

Embodiments relate to a method of fabricating a metal line in a semiconductor device using a dual damascene process which enhances reliability of the semiconductor device.

Embodiments relate to a method of fabricating a metal line that can include at least one of the following steps: forming a lower metal line in a first inter metal dielectric layer; and then sequentially forming a first anti-etch layer, a second inter metal dielectric layer and a second anti-etch layer over the first inter metal dielectric layer and the lower metal line, wherein the second inter metal dielectric includes a first trench formed therein; and then forming an oxide film on the second anti-etch layer and in the first trench; and then forming a first via hole by performing a first etching process on the oxide film, the second anti-etch layer and the second inter metal dielectric layer; and then forming a second trench and a second via hole by performing a second etching process using the second anti-etch layer as a mask; and then removing a portion of the first anti-etch layer exposed in the second via hole and the second anti-etch layer; and then forming an upper metal line in the second via hole and the second trench.

Embodiments relate to a method of fabricating a metal line that can include at least one of the following steps: forming a first inter metal dielectric layer over a substrate; and then forming a first trench in the first inter metal dielectric layer and forming a lower metal line in the trench; and then sequentially forming a first anti-etch layer and a second inter metal dielectric layer over the first inter metal dielectric layer and the lower metal line; and then forming a second trench in the second inter metal dielectric layer; and then forming a second anti-etch layer over the second inter metal dielectric layer and in the second trench; and then forming an oxide film in the second trench and over the portion of the second anti-etch layer formed in the second trench; and then forming a first via hole extending through the oxide film, the second anti-etch layer and partially into the second inter metal dielectric layer, wherein, the first via hole has a width less than the width of the second trench; and then forming a third trench and a second via hole exposing the first anti-etch layer by performing a dry etching process; and then forming an upper metal line by burying a metal material in the second via hole and the third trench.

Embodiments relate to a method of fabricating a metal line that can include at least one of the following steps: sequentially forming a first silicon nitride layer and a second inter metal dielectric layer over a first inter metal dielectric layer and a lower copper metal line formed in a first trench in the first inter metal dielectric layer; and then forming a second trench in the second inter metal dielectric layer; and then forming a second silicon nitride layer over the second inter metal dielectric layer and in the second trench; and then forming an oxide film in the second trench and over the portion of the second silicon nitride layer formed in the second trench; and then forming a first via hole extending through the oxide film, the second silicon nitride layer and partially into the second inter metal dielectric layer, wherein, the first via hole has a width less than the width of the second trench; and then forming a third trench and a second via hole exposing the first silicon nitride layer by performing a dry etching process; and then forming an upper copper metal line in the second via hole and the third trench and connected to the lower copper line.

DRAWINGS

Example FIGS. 1 to 5 illustrate a method of fabricating a metal line, in accordance with embodiments.

DESCRIPTION

As illustrated in example FIG. 1, interlayer dielectric layer 20 can be formed on and/or over semiconductor substrate 10. First inter metal dielectric (IMD) layer 30 can then be formed on and/or over the interlayer dielectric layer 20. A photoresist can then be formed on and/or over first IMD layer 30 is applied a photoresist. The applied photoresist is exposed and developed to form a first mask. First trench 32 can then be formed by etching first IMD layer 30. Lower metal line 34 is formed by filing a metal material in first trench 32. Particularly, lower metal line 34 can be formed by depositing a metal such as copper (Cu) on and/or over first trench 32 and first IMD 30 and then performing a planarization process.

First anti-etch layer 40 and second IMD layer 50 can then be sequentially deposited on and/or over first IMD layer 30 having lower metal line 34. First anti-etch layer 40 can be formed of silicon nitride and deposited at a thickness of between 1000 to 2000 Å. First anti-etch layer 40 can be used as an etch endpoint when the inter metal dielectric layer is etched in a subsequent process to prevent a pattern defect and damage of a lower thin film caused by over-etching due to the difference in etching rates with the inter metal dielectric layer.

A second photoresist is then formed over second IMD layer 50. The applied photoresist can then be exposed and developed to form second mask 54. Second trench 52 can then be formed in second IMD layer 50 using second mask 54. First inter metal dielectric layer 30 and second inter metal dielectric layer 50 can be formed of the same material, such as fluorine doped silicate glass (FSG).

Figure 2:
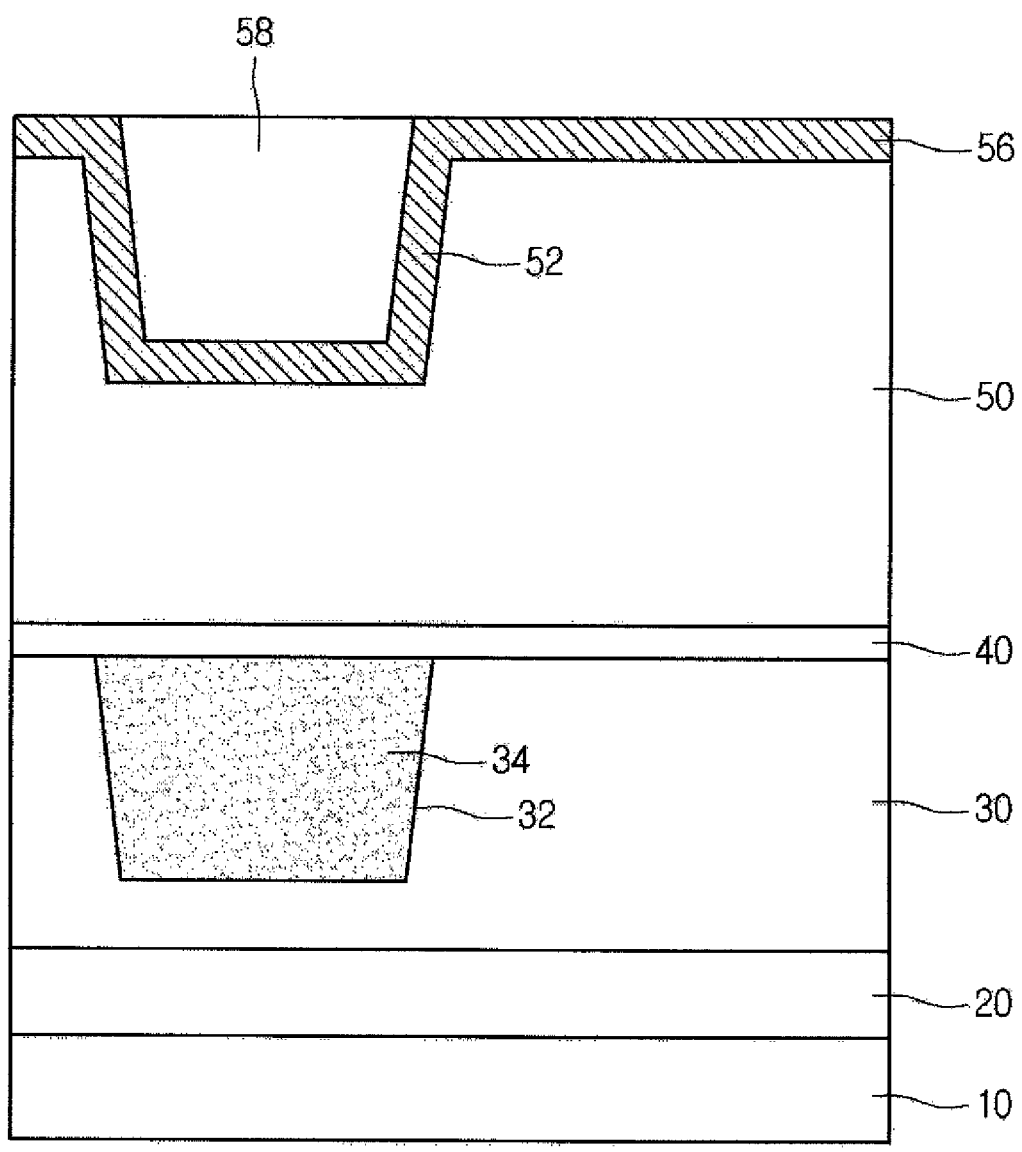

As illustrated in example FIG. 2, second mask 54 can be removed after formation of second trench 52. Second anti-etch layer 56 can then be deposited in second trench 54 and on and/or over second inter metal dielectric layer 50. Second anti-etch layer 56 can be formed of silicon nitride and formed 1.5 to 3 times thicker than first anti-etch layer 40.

After second anti-etch layer 56 is deposited, an oxide film can be formed in second trench 52 and on and/or over second anti-etch layer 56. The oxide film can be formed 1 to 3 times thicker than the height of second trench 52. Oxide film can be formed of tetra ethyl ortho silicate (TEOS) or undoped silicate glass (USG) using chemical vapor deposition. A planarization process can then be performed on the oxide film using second anti-etch layer 56 as a stop layer to form oxide film 58 buried inside second trench 52 and on second anti-etch layer 56. A third photoresist can then be formed on and/or over second anti-etch layer 56 and oxide film 58 formed thereon. The applied third photoresist can then be exposed and developed to form a third mask.

Figure 3:
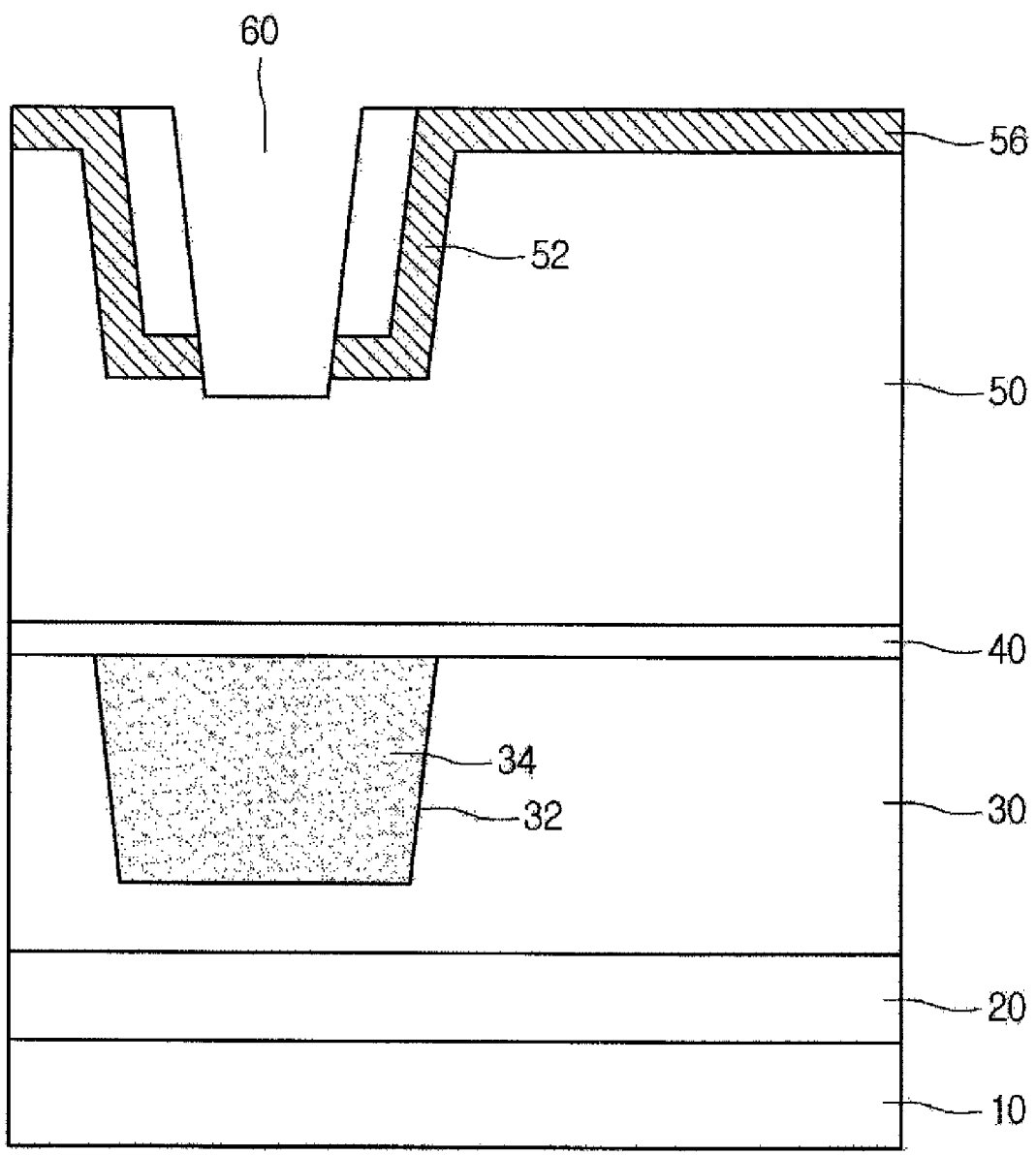

As illustrated in example FIG. 3, oxide film 58 and second anti-etch layer 56 can then be etched using the third mask and second inter metal dielectric layer 50 is further etched by 100 to 200 Å to form first via hole 60 extending through oxide layer 58, anti-etch layer 56 and partially into second IMD layer 50. First via hole 60 can be formed having a width that is less than the width of second trench 52.

Figure 4:
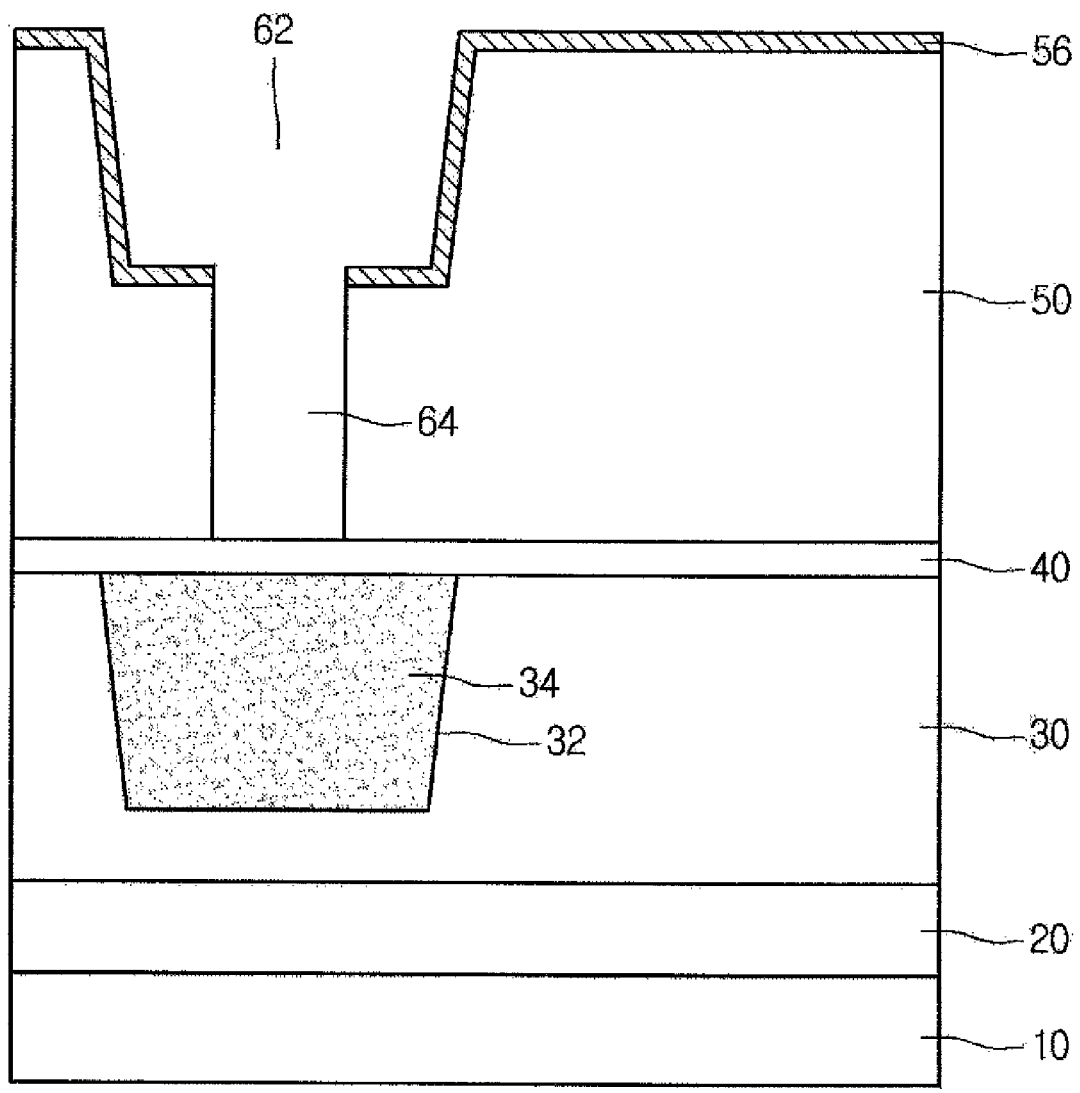

As illustrated in example FIG. 4, the third mask can then be removed by an ashing process. Oxide film 58 inside second trench 52 and a portion of second inter metal dielectric layer 50 provided spatially below first via hole 60 can then be removed by a dry etching to form third trench 62 and second via hole 64 exposing first anti-etch layer 40.

The uppermost surface of second inter metal dielectric layer 50 provided below anti-etch layer 56 is not etched due to the presence of second anti-etch layer 56, making it possible to prevent a formation of an upper metal line with a saw-tooth shape. Second via hole 64 can be formed having a width that is the same as the width of first via hole 60 when performing the dry etching for forming second via hole 64. The entire second anti-etch layer 56 and the portion of first anti-etch layer 40 exposed by second via hole 64 can then be are removed by the dry etching. Any remaining portion of second anti-etch layer 56 not removed by the dry etching can be removed through a subsequent wet etching process.

Figure 5:
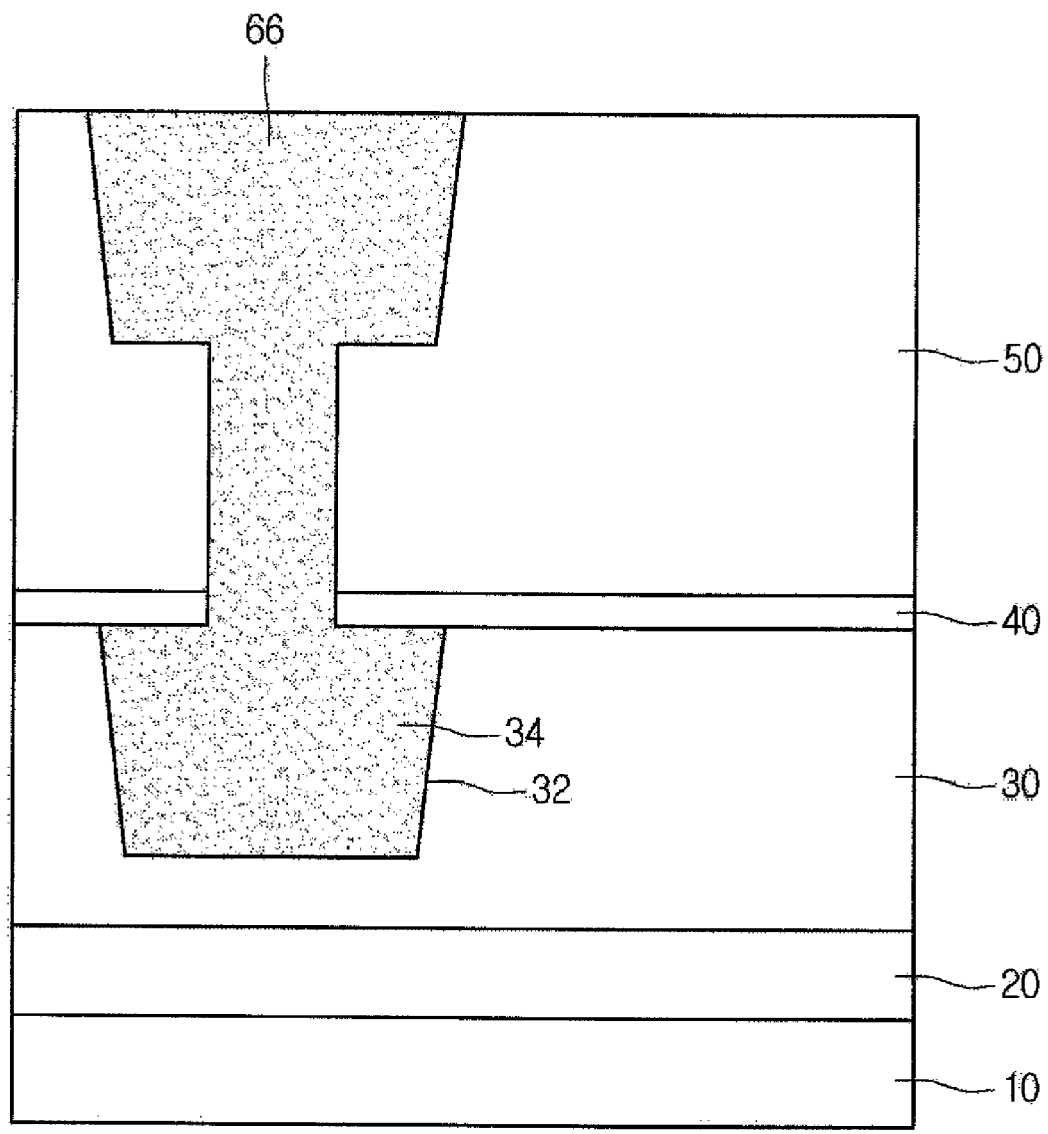

As illustrated in example FIG. 5, a metal material can then be buried inside second via hole 64 and third trench 62 to form upper metal line 66. Upper metal line 66 can be formed by depositing a copper material on and/or over third trench 62 and second inter metal dielectric layer 50 and then performing a planarization process. A barrier metal can be formed in third trench 62 and second via hole 64 prior to burying upper metal line 66. The barrier metal may be formed of Ta or TaN.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a metal line comprising:
   forming a lower metal line in a first inter metal dielectric layer; and then
   sequentially forming a first anti-etch layer, a second inter metal dielectric layer and a second anti-etch layer over the first inter metal dielectric layer and the lower metal line, wherein the second inter metal dielectric includes a first trench formed therein; and then
   forming an oxide film on the second anti-etch layer and in the first trench; and then
   forming a first via hole by performing a first etching process on the oxide film, the second anti-etch layer and the second inter metal dielectric layer; and then
   forming a second trench and a second via hole by performing a second etching process using the second anti-etch layer as a mask; and then
   removing a portion of the first anti-etch layer exposed in the second via hole and the second anti-etch layer; and then
   forming an upper metal line in the second via hole and the second trench.

2. The method of claim 1, wherein the first anti-etch layer and the second anti-etch layer are formed of silicon nitride (SiN).

3. The method of claim 1, wherein the first anti-etch layer is deposited at a thickness of between 1000 to 2000 Å.

4. The method of claim 1, wherein the second anti-etch layer is formed 1.5 to 3 times thicker than the first anti-etch layer.

5. The method of claim 1, wherein the oxide film is formed 1 to 3 times thicker than the height of the second trench.

6. The method of claim 1, wherein the oxide film is formed of at least one of tetra ethyl ortho silicate (TEOS) and undoped silicate glass (USG).

7. The method of claim 1, wherein during forming the first via hole, the second inter metal dielectric layer is etched by between 100 to 200 Å.

8. The method of claim 1, wherein the second etching process exposes the second anti-etch layer in the second trench.

9. The method of claim 1, wherein removing the portion of the first anti-etch layer exposed in the second via hole and the second anti-etch layer comprises:
   performing a dry etching and then performing a wet etching.

10. The method of claim 1, further comprising, after removing a portion of the first anti-etch layer exposed in the second via hole and the second anti-etch layer and before forming the upper metal line:
    forming a barrier metal in the second via hole and the second trench.

11. The method of claim 1, wherein the first inter metal dielectric layer and the second inter metal dielectric layer are formed of the same material.

12. The method of claim 11, wherein the first inter metal dielectric layer and the second inter metal dielectric layer are formed of fluorine doped silicate glass (FSG).

13. The method of claim 1, wherein the first via hole has a width smaller than the width of the first trench.

14. The method of claim 1, wherein the width of the second via hole is the same as the width of the first via hole.

15. A method comprising:
    forming a first inter metal dielectric layer over a substrate; and then
    forming a first trench in the first inter metal dielectric layer and forming a lower metal line in the trench; and then
    sequentially forming a first anti-etch layer and a second inter metal dielectric layer over the first inter metal dielectric layer and the lower metal line; and then
    forming a second trench in the second inter metal dielectric layer; and then
    forming a second anti-etch layer over the second inter metal dielectric layer and in the second trench; and then forming an oxide film in the second trench and over the portion of the second anti-etch layer formed in the second trench; and then forming a first via hole extending through the oxide film, the second anti-etch layer and partially into the second inter metal dielectric layer, wherein, the first via hole has a width less than the width of the second trench; and then forming a third trench and a second via hole exposing the first anti-etch layer by performing a dry etching process; and then forming an upper metal line by burying a metal material in the second via hole and the third trench.

16. The method of claim 15, wherein the lower metal line and the upper metal line are composed of copper.

17. The method of claim 15, wherein the first anti-etch layer is formed of silicon nitride and deposited at a thickness of between 1000 to 2000 Å.

18. The method of claim 15, wherein the second anti-etch layer is formed of silicon nitride and formed 1.5 to 3 times thicker than the first anti-etch layer.

19. The method of claim 15, wherein the oxide film is formed 1 to 3 times thicker than the height of second trench and composed of tetra ethyl ortho silicate (TEOS) or undoped silicate glass (USG).

20. A method comprising:

sequentially forming a first silicon nitride layer and a second inter metal dielectric layer over a first inter metal dielectric layer and a lower copper metal line formed in a first trench in the first inter metal dielectric layer; and then forming a second trench in the second inter metal dielectric layer; and then forming a second silicon nitride layer over the second inter metal dielectric layer and in the second trench; and then forming an oxide film in the second trench and over the portion of the second silicon nitride layer formed in the second trench; and then forming a first via hole extending through the oxide film, the second silicon nitride layer and partially into the second inter metal dielectric layer, wherein, the first via hole has a width less than the width of the second trench; and then forming a third trench and a second via hole exposing the first silicon nitride layer by performing a dry etching process; and then forming an upper copper metal line in the second via hole and the third trench and connected to the lower copper line.

* * * * *